United States Patent
Takaoka et al.

(10) Patent No.: US 7,276,841 B2
(45) Date of Patent: Oct. 2, 2007

(54) THICK FILM ELECTRODE AND MULTILAYER CERAMIC ELECTRONIC DEVICE

(75) Inventors: Hidekiyo Takaoka, Kusatsu (JP); Satoshi Shindou, Omihachiman (JP); Satoru Noda, Hikone (JP); Kunihiko Hamada, Kyoto (JP)

(73) Assignee: Murata Manufacturing Co., Ltd., Kyoto (JP)

( * ) Notice: Subject to any disclaimer, the term of this patent is extended or adjusted under 35 U.S.C. 154(b) by 0 days.

(21) Appl. No.: 11/426,374

(22) Filed: Jun. 26, 2006

(65) Prior Publication Data

US 2006/0232170 A1    Oct. 19, 2006

Related U.S. Application Data

(63) Continuation of application No. PCT/JP2004/019362, filed on Dec. 24, 2004.

(30) Foreign Application Priority Data

Dec. 26, 2003  (JP) .............................. 2003-433680

(51) Int. Cl.
    *H01L 41/08* (2006.01)
(52) U.S. Cl. ........................ 310/363; 310/328; 310/364
(58) Field of Classification Search ................ 310/328, 310/363, 364, 366
    See application file for complete search history.

(56) References Cited

U.S. PATENT DOCUMENTS

| | | | | |
|---|---|---|---|---|
| 4,140,936 A | * | 2/1979 | Bullock | ...................... 310/328 |
| 5,245,734 A | * | 9/1993 | Issartel | ...................... 29/25.35 |
| 5,519,279 A | * | 5/1996 | Zimnicki | ...................... 310/363 |
| 6,307,306 B1 | * | 10/2001 | Bast et al. | .................. 310/366 |
| 6,522,052 B2 | * | 2/2003 | Kihara et al. | ................ 310/366 |
| 6,573,639 B1 | * | 6/2003 | Heinz et al. | ................. 310/363 |
| 6,731,050 B2 | * | 5/2004 | Bindig et al. | ................ 310/366 |
| 6,798,123 B2 | * | 9/2004 | Bindig et al. | ................ 310/364 |

FOREIGN PATENT DOCUMENTS

| | | |
|---|---|---|
| JP | 03-007939 U | 1/1991 |
| JP | 05-218519 A | 8/1993 |
| JP | 2001-210884 A | 8/2001 |
| JP | 2002-009356 A | 1/2002 |
| JP | 2002261339 A | 9/2002 |

OTHER PUBLICATIONS

International Search Report issued in corresponding International Application No. PCT/JP2004/019362, mailed on Mar. 8, 2005.
Official Communication cited in corresponding Japanese Patent Application No. 2005-516648, dated Oct. 11, 2006.
Official communication issued in the Japanese Patent Application No. 2005-516648, mailed on Jan. 19, 2007.

* cited by examiner

*Primary Examiner*—Mark Budd
(74) *Attorney, Agent, or Firm*—Keating & Bennett, LLP

(57) ABSTRACT

A multilayer ceramic device includes an external electrode disposed on a piezoelectric ceramic body including internal electrodes. The external electrode is a sintered body in which an Ag grid is integrally embedded in a coating film primarily composed of Ag. Therefore, it is possible to obtain a multilayer ceramic device having outstanding properties, such as durability and moisture resistance, without leading to poor electrical continuity and a decrease in conductivity even when a continuous operation is performed for a prolonged period of time.

10 Claims, 6 Drawing Sheets

THICK FILM ELECTRODE AND MULTILAYER CERAMIC ELECTRONIC DEVICE

BACKGROUND OF THE INVENTION

1. Field of the Invention

The present invention relates to thick film electrodes and multilayer ceramic electronic devices. In particular, the present invention relates to a thick film electrode disposed on a surface of any one of various electronic devices, such as multilayer ceramic electronic devices, and a multilayer ceramic electronic device, such as a multilayer piezoelectric device including the thick film electrode as an external electrode.

2. Description of the Related Art

In a conventional multilayer ceramic electronic device, such as a multilayer piezoelectric device, thick-film external electrodes primarily composed of a conductive material, such as Ag, are disposed at both end surfaces of a multilayer piezoelectric component in which an internal electrode is embedded.

In general, the external electrodes are formed by printing or applying a conductive paste on the multilayer piezoelectric component and then performing firing. The conductive paste is formed by kneading a conductive powder, such as Ag, a glass frit, an organic resin, and an organic solvent.

However, in such a multilayer ceramic electronic device, repeated expansion and contraction of the ceramic laminate during polarization treatment or in the subsequent operation for a prolonged period causes the ceramic laminate to fatigue, thus resulting in a crack. Then, the crack extends to the external electrode, thereby fracturing the external electrode. As a result, the multilayer ceramic electronic device does not function as an electronic device.

Accordingly, a known multilayer ceramic capacitor-type electrostrictive device has been proposed, the device being produced by bringing a conductive component, such as a metal plate, steel wool, or a conductive rubber, into contact with the side surface of an external electrode, covering the conductive component with a heat-shrinkable tube, and shrinking the heat-shrinkable tube with a hot blast (see, for example, Japanese Unexamined Patent Application Publication No. 5-218519).

Japanese Unexamined Patent Application Publication No. 5-218519 attempts to ensure the electrical connection by bonding the conductive component to the external electrode, even if a crack occurs in the laminate or the external electrode.

In another known technique, a multilayer piezoelectric actuator device has been proposed, the device including a pair of conductive members and a pair of external electrodes. Each conductive member is spaced from and facing the corresponding side surface, and each conductive member is connected to the corresponding external electrode (see, for example, Japanese Unexamined Patent Application Publication No. 2002-9356).

In Japanese Unexamined Patent Application Publication No. 2002-9356, one end of the conductive member in the width direction is bonded to the external electrode by brazing, and the other end of the conductive member in the width direction is a free end. Even if a crack occurs in the laminate or the external electrode, this structure avoids the extension of the crack to ensure the continuity of the conductive member, thereby preventing a deterioration in function.

However, Japanese Unexamined Patent Application Publication No. 5-218519 has the following problems: as shown in FIG. 7, the conductive member 53 is merely bonded to the external electrode 52 with the heat-shrinkable tube 51. That is, the conductive member 53 is not integrally formed with the external electrode 51, which results in discontinuous adhesion at a bonded surface 54. Thus, when a crack 56 occurs in a ceramic laminate 55 because of, for example, a continuous operation for a prolonged period, a tensile stress acts in the directions of Arrows a and a'. As a result, the external electrode 52 may be ruptured, thus leading to poor electrical continuity.

Japanese Unexamined Patent Application Publication No. 5-218519 has further problems as described below: the external electrode 52 is bonded to the conductive member 53 as described above. That is, the contact between the external electrode 52 and the conductive member 53 establishes the continuity. Thus, if the device is subjected to high temperature and high humidity for a prolonged period of time, the conductivity disadvantageously decreases.

Furthermore, Japanese Unexamined Patent Application Publication No. 2002-9356 has the following problems: since the external electrode is not integrally formed with the conductive member, the device has low mechanical strength. Thus, similarly to Japanese Unexamined Patent Application Publication No. 5-218519, the occurrence of a crack in the laminate or the external electrode results in continuity failure. Moreover, if the device is subjected to high temperature and high humidity for a prolonged period of time, the conductivity disadvantageously decreases.

Japanese Unexamined Patent Application Publication No. 2002-9356 has further problems as follows: since the external electrode is bonded to the conductive member by brazing, stress is concentrated on the interface between the external electrode and the conductive member. Thus, detachment is likely to occur at the interface.

SUMMARY OF THE INVENTION

To overcome the problems described above, preferred embodiments of the present invention provide a thick film electrode having satisfactory properties, such as durability and moisture resistance, without leading to poor electrical continuity and a decrease in conductivity even when a continuous operation is performed for a prolonged period or the electrode is left standing for a prolonged period. Preferred embodiments of the present invention also provide a multilayer ceramic electronic device, such as a multilayer piezoelectric device, including the thick film electrode as an external electrode.

A thick film electrode according to a preferred embodiment of the present invention includes a sintered body that includes a conductive powder and a conductive reinforcing component, the conductive powder being integral with the conductive reinforcing component, wherein the conductive reinforcing component is in the form of a grid and is embedded in a coating film primarily including the conductive powder.

In the thick film electrode according to preferred embodiments of the present invention, the conductive reinforcing component has a core composed of a base metal and a surface composed of a noble metal.

At least the surface of the conductive reinforcing component is preferably conductive.

A portion of a line of the grid defining the conductive reinforcing component is exposed from the coating film to the exterior.

A multilayer ceramic electronic device according to another preferred embodiment of the present invention includes a ceramic body, an internal electrode, and an external electrode, the internal electrode being embedded in the ceramic body, the external electrode being disposed on a surface of the ceramic body, and the internal electrode being electrically connected to the external electrode, wherein the external electrode includes a sintered body including a conductive powder and a conductive reinforcing component, the conductive powder being integral with the conductive reinforcing component, and the conductive reinforcing component is in the form of a grid and is embedded in a coating film mainly containing the conductive powder.

The external electrode is defined by the thick film electrode according to preferred embodiments of the present invention.

In the multilayer ceramic electronic device according to preferred embodiments of the present invention, the coating film primarily including the conductive powder is disposed on the side surface of the ceramic body so as to be electrically connected to an end of the internal electrode, the conductive reinforcing component is in the form of the grid, and the conductive wire-shaped component is embedded in the coating film such that a portion of a line of the grid of the conductive reinforcing component is exposed at the surface of the coating film.

The multilayer ceramic electronic device according to preferred embodiments of the present invention further includes a grid member, the surface of the grid member being composed of a metal that melts at a soldering temperature, wherein the grid member is laminated on the external electrode to be electrically connected to the external electrode.

In the multilayer ceramic electronic device according to preferred embodiments of the present invention, the ceramic body is a piezoelectric component body including a piezoelectric material.

According to the above-described structure, the thick film electrode includes a sintered body that includes a conductive powder and a conductive reinforcing component, the conductive powder being integral with the conductive reinforcing component, wherein the conductive reinforcing component is in the form of a grid and is embedded in a coating film mainly containing the conductive powder. Thus, the mechanical strength of the thick film electrode is improved. In addition, even if the coating film is broken, it is possible to ensure the continuity with the conductive reinforcing component and to obtain a thick film electrode having outstanding durability.

Furthermore, the continuity of the sintered body including the conductive reinforcing component and the conductive powder is ensured by not merely contact but strong bonding of metal due to sintering. Thus, a deterioration in conductivity is prevented even if the device is subjected to high temperature and high humidity for a prolonged period and moisture resistance is improved.

In addition, the conductive reinforcing component has a core composed of a base metal and a surface composed of a noble metal. Thus, the oxidation of the base metal material is prevented during firing and the bondability of the conductive reinforcing component to the conductive powder is improved, thereby further improving durability.

Furthermore, at least the surface of the conductive reinforcing component is preferably conductive. Thus, a heat-resistant nonmetal material is used as the core, and the surface of the nonmetal material is composed of a noble metal material. As a result, heat resistance is ensured and durability is further improved.

Moreover, a portion of a line of the grid defining the conductive reinforcing component is exposed from the coating film to the exterior. Thus, the breakage of the conductive reinforcing component is prevented and durability is further improved.

According to the multilayer ceramic electronic device, the external electrode includes a sintered body that includes a conductive powder and a conductive reinforcing component, the conductive powder being integral with the conductive reinforcing component, wherein the conductive reinforcing component is in the form of a grid and is embedded in a coating film mainly including the conductive powder. Furthermore, the external electrode is defined by the thick film electrode described above. Thus, even when the multilayer ceramic electronic device is repeatedly expanded and contracted in the stacking direction, it is possible to prevent the rupture of the external electrode and to prevent a short circuit even if a high electric field is applied. Therefore, a multilayer ceramic electronic device, such as a multilayer piezoelectric device, having satisfactory durability and moisture resistance is obtained.

The reinforcement of the external electrode improves the strength of the external electrode, thus preventing the occurrence of a crack in the ceramic body. Furthermore, even if a crack occurs between the internal electrodes to rupture the coating film, the continuity is ensured with the conductive reinforcing component.

The device further includes the grid member, the surface of the grid member being composed of a metal that melts at a soldering temperature, wherein the grid member is laminated on the external electrode to be electrically connected to the external electrode. Thus, the surface of the grid member melts at the soldering temperature, thereby improving solderability.

Other features, elements, steps, characteristics and advantages of the present invention will become more apparent from the following detailed description of preferred embodiments of the present invention with reference to the attached drawings.

DETAILED DESCRIPTION OF PREFERRED EMBODIMENTS

Preferred embodiments of the present invention will be described with reference to the drawings.

Figure 1:
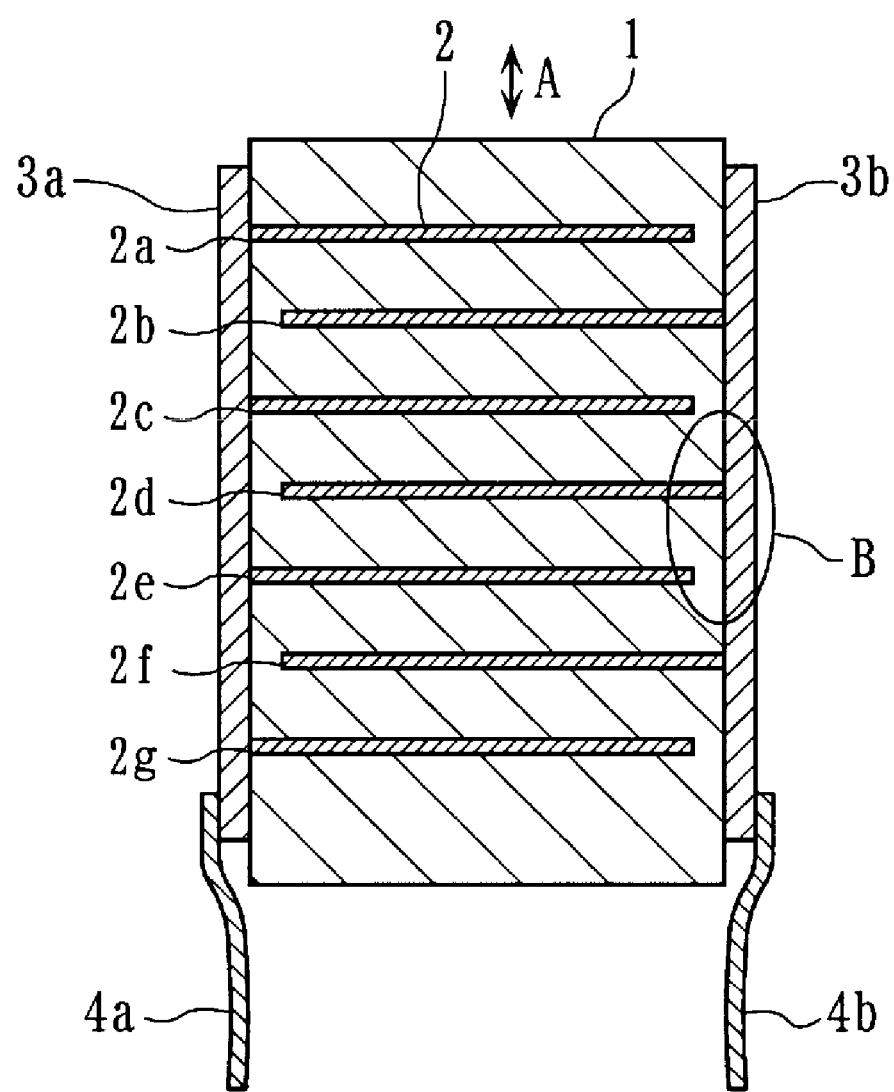
FIG. 1 is a schematic cross-sectional view of a multilayer piezoelectric device as a multilayer ceramic electronic device including a thick film electrode according to a preferred embodiment of the present invention.

FIG. 1 is a schematic cross-sectional view of a multilayer piezoelectric device as a multilayer ceramic electronic device including a thick film electrode according to a preferred embodiment (first preferred embodiment) of the present invention.

The multilayer piezoelectric device includes a piezoelectric ceramic body 1 primarily composed of lead zirconate titanate (hereinafter, referred to as "PZT"), a plurality of internal electrodes 2a to 2g embedded in the piezoelectric ceramic body 1, the internal electrodes 2a to 2g being arranged in parallel, thick-film external electrodes 3a and 3b disposed at both ends of the piezoelectric ceramic body 1, and leads 4a and 4b connected to the external electrodes 3a and 3b, respectively.

In the multilayer piezoelectric device, one end of each of the internal electrodes 2a, 2c, 2e, and 2g is electrically connected to one external electrode 3a, and one end of each of internal electrodes 2b, 2d, and 2f is electrically connected to the other external electrode 3b. When a voltage is applied between the external electrode 3a and the external electrode 3b via the leads 4a and 4b, respectively, the multilayer piezoelectric device expands and contracts in the stacking directions of Arrow A by longitudinal piezoelectric effect.

Figure 2:
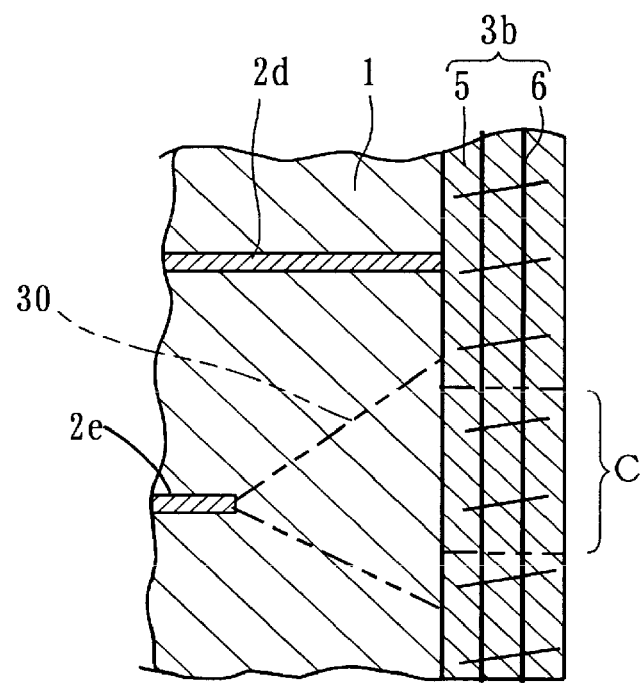
FIG. 2 is an enlarged view of portion B in FIG. 1.

FIG. 2 is an enlarged view of B portion in FIG. 1. The external electrode 3b is a thick film electrode according to a preferred embodiment of the present invention.

That is, the external electrode 3b is a sintered body in which a Ag grid 6 defining a conductive reinforcing component is completely embedded in a coating film 5 composed of a Ag powder as a conductive material to form a unitary structure.

The external electrode 3a preferably has the same structure as that of the external electrode 3b. Thus, the description thereof is omitted.

In the first preferred embodiment, the Ag grid 6 is embedded in the coating film 5 primarily composed of the Ag powder to form a unitary structure, and then firing is performed to form the external electrode 3b. Even if the multilayer piezoelectric device is repeatedly expanded and contracted in the directions of Arrow A for a prolonged period of time to generate, for example, cracks 30, as shown in virtual lines indicated between the internal electrode 2d and the internal electrode 2e in the piezoelectric ceramic body 1, and to rupture the coating film 5 as shown in C portion in the figure, the internal electrodes 2 are electrically connected to the external electrode 3b with the Ag grid 6 providing reinforcement of the external electrode 3b. In this manner, even if a high voltage is applied, the continuity is ensured.

Furthermore, a sufficient contact area between the Ag grid 6 and the coating film 5 is ensured. Thus, the detachment at the interface between the Ag grid 6 and the coating film 5 is prevented. As a result, a multilayer piezoelectric device having outstanding durability is obtained.

Moreover, the Ag grid 6 is not merely in contact with the sintered body of the Ag powder in the coating film 5 but is securely bonded to the sintered body by firing. Thus, even if the device is subjected to high temperature and high humidity, a decrease in conductivity is prevented. Furthermore, moisture resistance is improved.

A process for producing the multilayer piezoelectric device will be described in detail below.

Predetermined amounts of starting ceramic materials, such as $Pb_3O_4$, $ZrO_2$, and $TiO_2$, are measured and charged into a ball mill including grinding media, such as zirconia balls. The mixture is, for example, mixed, pulverized, calcined to produce a mixed ceramic powder. An organic binder, a dispersant, and water serving as a solvent are added to the mixed ceramic powder to form a slurry. Then, a ceramic green sheet (hereinafter, simply referred to as a "ceramic sheet") primarily composed of PZT is produced by a doctor blade method.

Figure 3:
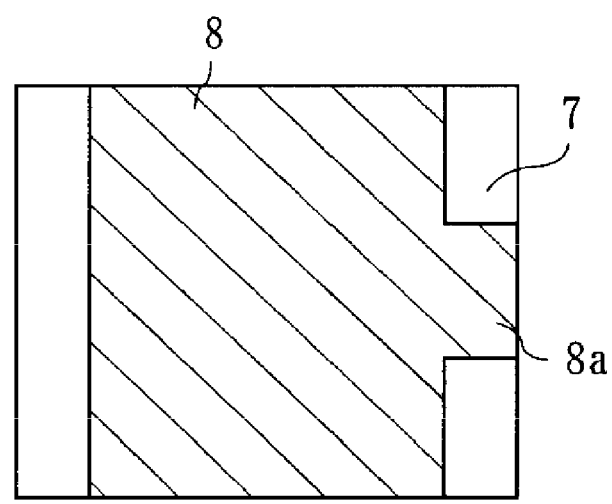
FIG. 3 is a plan view of a state in which a conductive pattern is disposed on a ceramic sheet.

As shown in FIG. 3, for example, a conductive pattern 8 having a convex portion 8a is formed by screen printing on a ceramic sheet 7 with a conductive paste for an internal electrode, the paste including Ag and Pd, the Ag/Pd ratio by weight being adjusted to 70/30.

Figure 4:
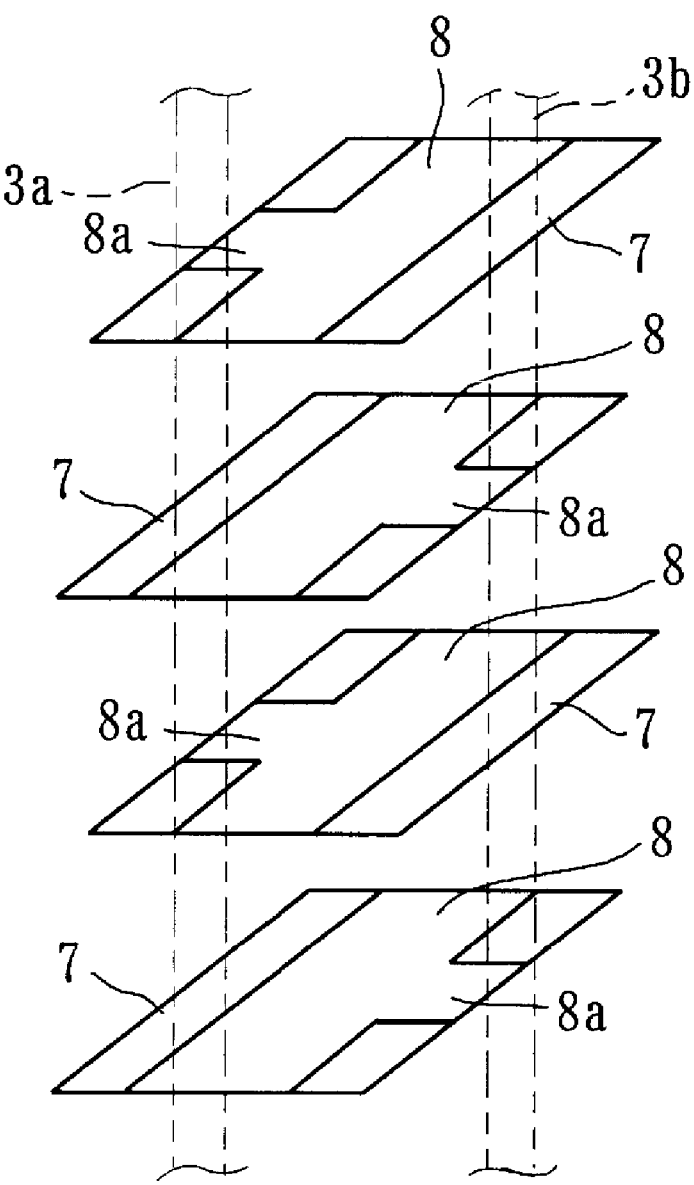
FIG. 4 is a perspective view illustrating an example of a process for producing the multilayer piezoelectric device.

As shown in FIG. 4, a predetermined number (for example, 500) of the ceramic sheets 7 each including the convex portion 8a is laminated such that the convex portions 8a are alternately disposed. The resulting laminated structure is disposed between ceramic sheets each having no conductive pattern 8 to form a laminate. The external electrode 3a or the external electrode 3b is electrically connected to every other conductive pattern 8 as shown in virtual lines. Subsequently, the laminate is heated to a temperature of about 500° C. or less to perform degreasing. Then, the resulting laminate is fired at about 950° C. to about 1,100° C. to produce the piezoelectric ceramic body 1.

An Ag paste is applied to both ends of the piezoelectric ceramic body 1 to form the coating films 5. The Ag grid 6 is completely embedded in each coating film 5. The coating film 5 is dried and then fired at about 700° C. to about 800° C. Thereby, the external electrodes 3a and 3b are defined by the sintered body in which the Ag grid 6 is integrally embedded in the coating film 5. As a result, a multilayer piezoelectric device having a predetermined dimensions (for example, a length of about 7 mm, a width of about 7 mm, and a thickness of about 35 mm) is produced.

Figure 5:
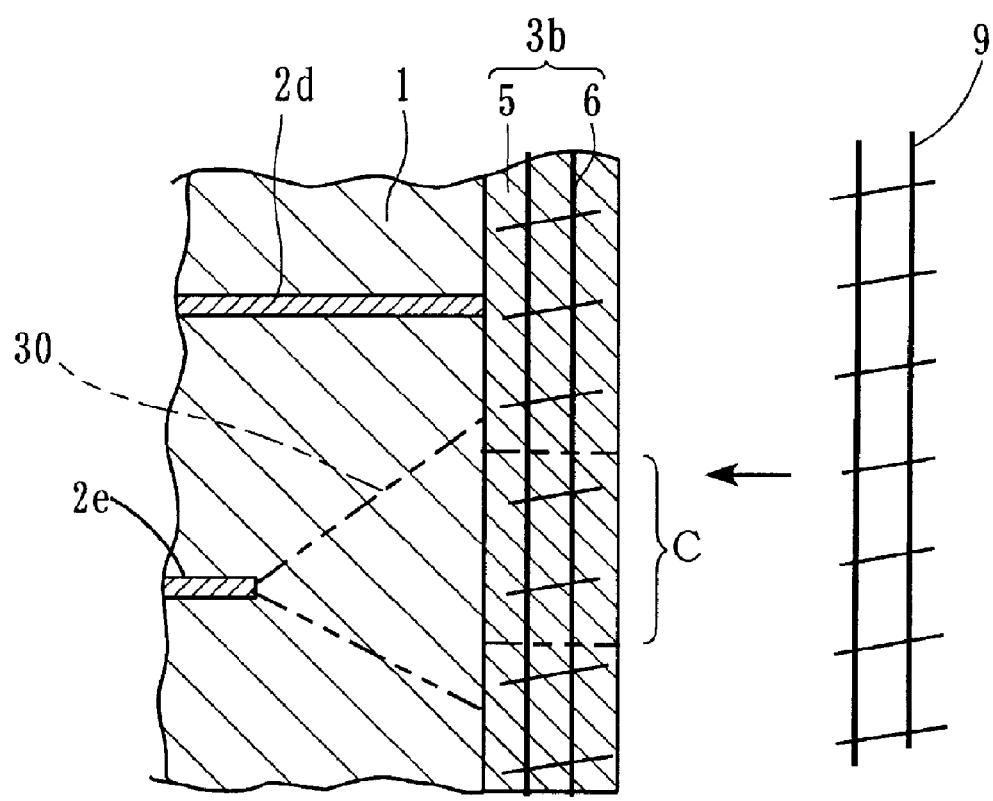
FIG. 5 is a fragmentary enlarged view of a multilayer piezoelectric device according to a second preferred embodiment of the present invention.

FIG. 5 is a fragmentary enlarged view of a multilayer piezoelectric device according to a second preferred embodiment of the present invention.

In the second preferred embodiment, in addition to the structure according to the first preferred embodiment, a grid conductive member 9 is laminated on the external electrode 3b and spot-welded to be electrically connected to the external electrode 3b.

Specifically, the conductive member 9 has a core composed of Al or other suitable material. The surface of the conductive member is covered with a metal that melts at a soldering temperature, for example, Sn.

The surface of the conductive member 9 melts at the soldering temperature, thus improving solderability, in addition to the advantages described in the first preferred embodiment.

Even if the Ag grid 6 is ruptured, the continuity of the coating film 5 is ensured with the conductive member 9, thus further improving durability.

Figure 6:
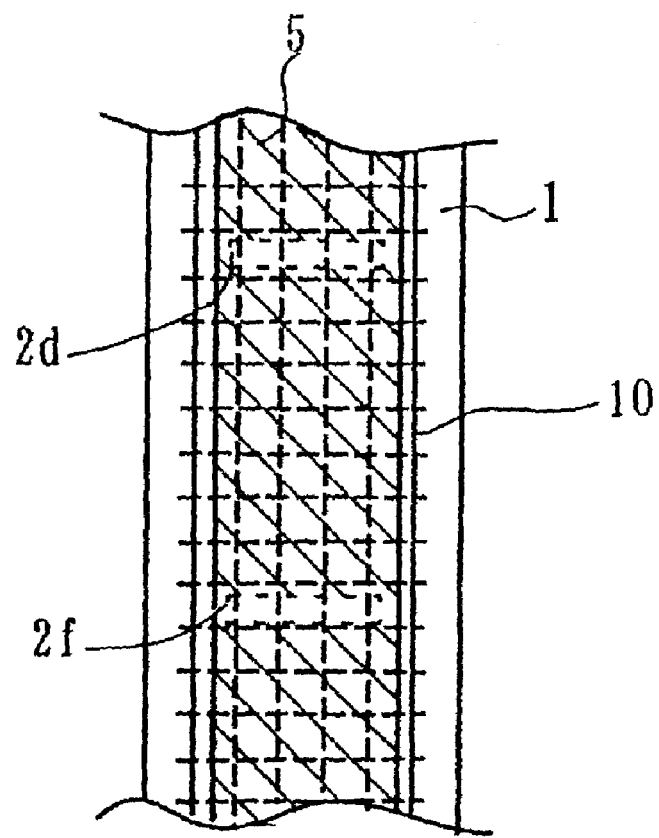
FIG. 6 is a fragmentary enlarged view of a multilayer piezoelectric device according to a third preferred embodiment of the present invention.
Figure 7:
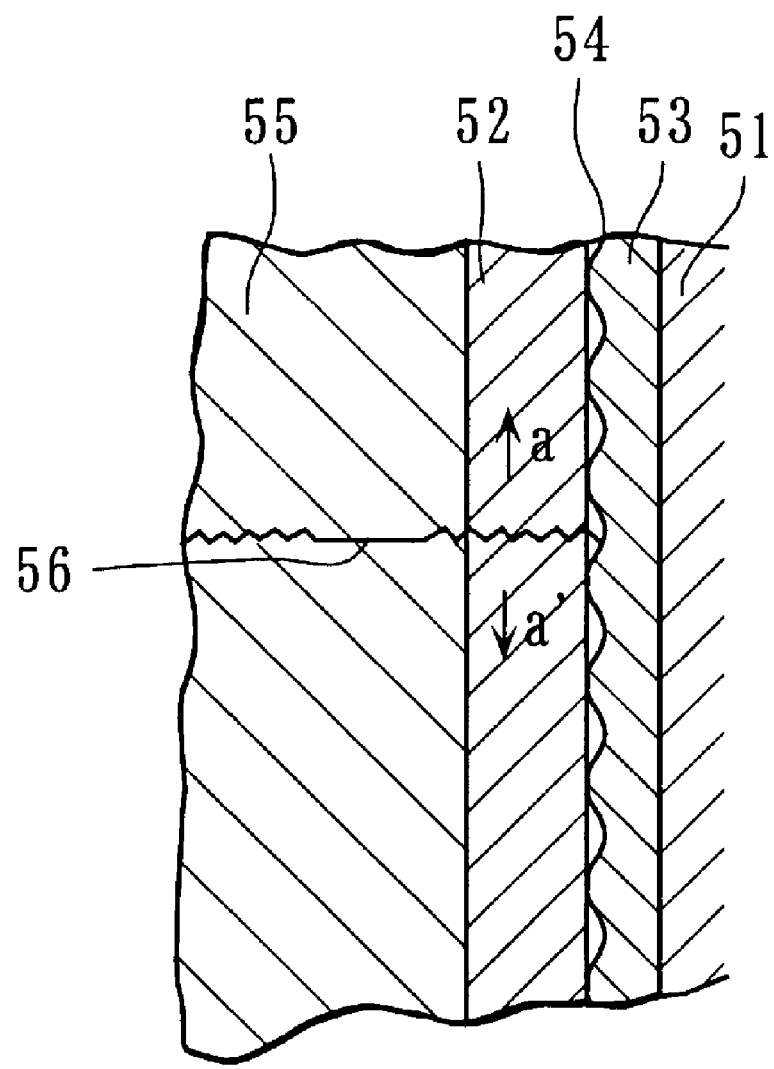
FIG. 7 is a fragmentary enlarged view illustrating the structure and the problem of a known electrostrictive device.

FIG. 6 is a fragmentary enlarged plan view of the external electrode 3b (thick film electrode) according to a third preferred embodiment of the present invention.

In the third preferred embodiment, the conductive reinforcing component is formed of a Ag grid 10 as in the first and second preferred embodiments. The Ag grid 10 is embedded in the coating film 5. At least a portion of a line of the grid of the Ag grid 10 is exposed at the surface of the coating film 5.

Since at least a portion of a line of the grid of the Ag grid 10 is exposed at the surface of the coating film 5, an end of the Ag grid 10 is a free end. As a result, a rupture of the Ag grid 10 is prevented, thus significantly improving durability.

The present invention is not limited to the above-described preferred embodiments. In the preferred embodiments, the conductive reinforcing component is preferably composed of Ag in view of moisture resistance and solderability. However, a material that has a resistivity that is less than that of the conductive powder material may be preferably used. A noble metal, such as Pd, Au, or Pt, may be used in addition to Ag. Alternatively, a heat-resistant base metal material, such as Ni, having higher strength may also be used.

Furthermore, it is preferred that the core be composed of a base metal, such as Ni, a Ni alloy, or Cr, having satisfactory heat resistance, and the surface be covered with an oxidation-resistant material, such as oxide glass or a noble metal material. In this case, the oxide glass and the noble metal material diffuse in the conductive powder during firing. In addition, if the oxidation-resistant material has poor heat resistance, the oxidation-resistant material leaks out of the sintered body at a firing temperature.

Furthermore, it is preferred that the core of the conductive reinforcing component be composed of a heat-resistant ceramic fiber or a glass fiber that can withstand the firing temperature to maintain its shape, and the surface of the conductive reinforcing component be composed of any one of the conductive metal materials described above.

In the first to third preferred embodiments, the process in which the conductive reinforcing component is embedded in the coating film is used. However, a process may be used, the process including placing the conductive reinforcing component on the coating film, forming a coating film on the conductive reinforcing component, and performing firing.

With respect to the location of the conductive reinforcing component on the external electrode, the external electrode must be formed integrally with the conductive powder by firing. In addition to the structure in which the conductive reinforcing component is embedded in the coating film as in the preferred embodiments described above, firing may be performed in a state in which the conductive reinforcing component is exposed at the surface, thereby forming a unitary structure.

In the above-described preferred embodiments, the multilayer piezoelectric device is described as the multilayer ceramic electronic device. The present invention is also applicable to resistors, multilayer ceramic capacitors used at medium to high voltages, and other suitable components. In particular, in the thick film electrode produced by sintering, the resistivity is greater than that of a metal defining the thick film electrode. Thus, by using the thick film electrode according to preferred embodiments of the present invention, it is possible to obtain various multilayer ceramic electronic devices each including a low-resistant external electrode having sufficient reliability without the occurrence of a crack.

EXAMPLES

Specific examples of various preferred embodiments of the present invention will be described below.

Example 1

A conductive paste was prepared, the conductive paste being formed of an organic vehicle including about 50 to about 60 percent by weight of a Ag powder having an average particle size of about 2.0 μm, about 0.1 to about 7 percent by weight of glass frit, and an ethyl cellulose resin (binder resin) and butyl carbitol (organic solvent) constituting the remainder. The conductive paste is applied to both side surfaces of a multilayer piezoelectric body, including internal electrodes and having a length of about 7 mm, a width of about 7 mm, and a thickness of about 30 mm, by printing with a metal mask to form coating films each having a width of about 4 mm and a thickness of about 400 μm at both side surfaces of the multilayer piezoelectric body. An Ni grid having a wire diameter of about 100 μm and a mesh opening of 100 mesh was embedded in each coating film, dried at about 150° C. for about 10 minutes in an oven, and fired at about 740° C. in an air atmosphere to produce an external electrode (thick film electrode), in which the Ni grid was completely embedded in each coating film to form a unitary structure, at each side surface of the multilayer piezoelectric device.

Cu leads each having a wire diameter of about 250 μm and covered with an enamel were bonded to the external electrodes by soldering with a solder including Sn as a main component, about 3 percent by weight of Ag, and about 0.5 percent by weight of Cu, thereby connecting the leads to the external electrodes. Polarization treatment was performed in oil at a temperature of about 80° C. and a voltage of about 3 kV/mm to impart piezoelectric properties. Next, washing was performed with a hydrocarbon cleaning agent to produce a sample of Example 1.

Example 2

External electrodes in which Ag grids were completely embedded in both side surfaces of the multilayer piezoelectric device to form a unitary structure were formed in the same process and procedure as those in Example 1, except that the Ag grids each having a wire diameter of about 100 μm and a mesh opening of 100 mesh were used in place of the Ni grids. After the connection of leads, piezoelectric properties were imparted, thereby producing a sample of Example 2.

Example 3

The same Ni grids as those used in Example 1 were electrolytically plated with Ag to produce Ni grids covered with Ag films each having a thickness of about 30 μm.

Then, external electrodes in which the Ag-plated Ni grids were embedded in both side surfaces of a multilayer piezoelectric device to form a unitary structure were formed in the same process and procedure as those in Example 1. After leads were connected to the external electrodes, piezoelectric properties were imparted, thereby producing a sample of Example 3.

Example 4

Coating films each having a width of about 4 mm and a thickness of about 400 μm were formed on both side surfaces of a multilayer piezoelectric device having a length of about 7 mm, a width of about 7 mm, and a thickness of about 30 mm in the same process and procedure as those in Example 1. Then, Ni grids each having a width of about 5 mm, a wire diameter of about 150 μm, and a mesh opening of 40 mesh were embedded in the coating films such that at least a portion of a line of the grid was exposed at the surface of each coating film. The resulting device was dried at about 150° C. for about 10 minutes in an oven and then fired at about 740° C. in an air atmosphere. Thereby, an external electrode in which a portion of a line of the Ni grid was exposed at the surface was formed at each side surface of the multilayer piezoelectric device. After leads were connected to the external electrodes, piezoelectric properties were imparted, thereby producing a sample of Example 4.

Example 5

An external electrode in which a portion of a line of a Ag grid was exposed at the surface of the coating film was formed at each side surface of a multilayer piezoelectric device in the same process and procedure as those in Example 4, except that the Ag grid having a width of about 5 mm, a wire diameter of about 150 μm, and a mesh opening of 40 mesh was used in place of the Ni grid. After leads were connected to the external electrodes, piezoelectric properties were imparted, thereby producing a sample of Example 5.

Example 6

The same Ni grids as those used in Example 4 were electrolytically plated with Ag to produce Ni grids covered with Ag films each having a thickness of about 30 μm.

Then, external electrodes in which the Ag-plated Ni grids were embedded in both side surfaces of a multilayer piezoelectric device to form a unitary structure were formed in the same process and procedure as those in Example 4. After leads were connected to the external electrodes, piezoelectric properties were imparted, thereby producing a sample of Example 6.

Example 7

Al grids each having a wire diameter of about 100 μm and a mesh opening of 100 mesh were electrolytically plated with Sn to form the Al grids each covered with a Sn film having a thickness of 30 μm.

Coating films each having a thickness of about 400 μm were formed on both side surfaces of a multilayer piezoelectric device in the same process and procedure as those in Example 4. Then, the Ag-plated Ni grids were embedded in the coating films as in Example 6. The resulting device was fired to form external electrodes in which the Ag-plated Ni grids were partially embedded to form a unitary structure. The Sn-plated Al grids were spot-welded to the external electrodes to connect the Al grids to the surfaces of the external electrodes. After leads were connected to the Al grids, piezoelectric properties were imparted, thereby producing a sample of Example 7.

Comparative Example 1

Coating films each having a width of about 4 mm and a thickness of about 400 μm were formed on both side surfaces of a multilayer piezoelectric device having a length of about 7 mm, a width of about 7 mm, and a thickness of about 30 mm by printing with a metal mask in the same process and procedure as those in Example 1. After leads were connected, piezoelectric properties were imparted, thereby producing a sample of Comparative Example 1.

Comparative Example 2

Ni grids each having a wire diameter of about 100 μm and a mesh opening of 100 mesh were placed on the coating films of the sample of Comparative Example 1. A conductive adhesive was applied thereto and dried to connect the coating films with the Ni grids. Then, piezoelectric properties were imparted as in Example 1, thereby producing a sample of Comparative Example 2.

The resulting samples of the Examples and the Comparative Examples were evaluated for durability and moisture resistance.

Durability was evaluated as follows: the sample of each of the Examples and the Comparative Examples was driven by applying a triangular wave having a frequency of about 138 Hz and a voltage of about 200 V. A time required for rupture of the sample was measured.

Moisture resistance was evaluated as follows: the sample of each of the Examples and the Comparative Examples was subjected to a temperature of about 85° C. and a humidity of about 85% RH for about 500 hours. Insulation resistance (IR) was measured with an impedance analyzer (Model 4192A, manufactured by Hewlett-Packard Development Company, L.P.) before and after the test. The rate of change z was calculated according to Equation (1):

$$z = \{(x-y)/y\} \times 100 \quad (1)$$

wherein x represents insulation resistance (IR) (500 hours later), and y represents an initial value of insulation resistance (IR).

Furthermore, the samples of Examples 6 and 7 and Comparative Example 2 were also evaluated for solderability.

Solderability was evaluated as follows: isopropyl alcohol including 25 percent by weight of rosin was used as flux. Each of the samples of Examples 6 and 7 and Comparative Example 2 was immersed in a solder bath at about 250° C. for about 2 seconds, the solder bath including Sn as a main component, about 3 percent by weight of Al, and about 0.5 percent by weight of Cu. The solder coverage of the electrode surface of each external electrode was calculated.

Table 1 shows the structure of the external electrode (thick film electrode), the driving time, the rate of change of insulation resistance (IR), and the solder coverage of each of Examples and Comparative Examples.

TABLE 1

|   |   | Structure of external electrode (thick film electrode) | Driving time (hr) | Rate of change of insulation resistance (IR) (%) | Solder coverage (%) |
|---|---|---|---|---|---|
| Example | 1 | Integrated sintered body in which Ni grid is completely embedded | 0.5 | 2 | — |
|  | 2 | Integrated sintered body in which Ag grid is completely embedded | 2 | 5 | — |
|  | 3 | Integrated sintered body in which Ag-plated Ni grid is completely embedded | 31 | −3 | — |
|  | 4 | Integrated sintered body in which Ni grid is partly exposed at surface | 65 | 2 | — |

TABLE 1-continued

|  |  | Structure of external electrode (thick film electrode) | Driving time (hr) | Rate of change of insulation resistance (IR) (%) | Solder coverage (%) |
|---|---|---|---|---|---|
|  | 5 | Integrated sintered body in which Ag grid is partly exposed at surface | ≧300 | −1 | — |
|  | 6 | Integrated sintered body in which Ag-plated Ni grid is partly exposed at surface | ≧300 | 1 | 90 |
|  | 7 | Al-grid-attached Integrated sintered body in which Ag-plated Ni grid is partly exposed at surface | ≧300 | 3 | 98 |
| Comparative Example | 1 | Sintered body with coating film | 0 (ruptured in polarization) | −2 | — |
|  | 2 | Sintered body with coating film with Ni grid | 0.3 | 75 | 35 |

As is clear from Table 1, in Comparative Example 1, the external electrodes were formed of only the coating films. Thus, the sample ruptured in polarization, resulting in the failure of continuity. Therefore, the driving time was "0".

In Comparative Example 2, the sample ruptured in about 0.3 hours, resulting in the failure of continuity. In addition, the rate of change of insulating resistance (IR) was as high as about 75%. The solder coverage was as low as about 35%. Consequently, it was confirmed that each of durability, moisture resistance, and solderability was degraded.

The reason why the sample ruptured in a short duration of about 0.3 hours is believed to be that since each Ni grid was merely bonded to the corresponding coating film with the adhesive, stress was concentrated on the interface between each Ni grid and the corresponding coating film to detach each Ni grid from the corresponding coating film. Furthermore, the reason for a large rate of change of insulation resistance (IR) of about 75% is believed to be that since the continuity was achieved by merely the contact between the conductive adhesive and the Ag powder, i.e., since the metal materials were not bonded, the continuity was degraded.

In contrast, in Examples 1 and 2, each external electrode was a sintered body in which the Ni grid or the Ag grid was completely embedded to form a unitary structure. Thus, the contact area between each coating film and the corresponding Ni grid or Ag grid increased, and the driving time was prolonged by reinforcing the external electrode, as compared with Comparative Example 2. That is, durability was improved. Furthermore, the continuity was achieved by not merely a contact as in Comparative Example 1 but bonding of the metal. Therefore, the rate of change of insulation resistance (IR) was reduced to be about 2% or about 5%. That is, moisture resistance was also improved.

In Example 3, each Ni grid was covered with the Ag film. Thus, the oxidation of each Ni grid was suppressed during firing to improve the bondability between each coating film and the corresponding Ni grid. Furthermore, Ni has higher strength than that of Ag. Thus, the driving time was as long as about 31 hours. That is, durability was improved. Similarly to Example 1, the continuity was achieved by bonding of metal. Thus, the rate of change of insulation resistance (IR) was suppressed to be about −3%. That is, outstanding moisture resistance was obtained.

In Example 4, at least a portion of a line of each Ni grid was exposed at the surface of the corresponding coating film. Thus, rupturing of each Ni grid was prevented. As a result, it was confirmed that the driving time was about 65 hours, and the rate of change of insulation resistance (IR) was as low as about −1%.

In Example 5, at least a portion of a line of each Ag grid was exposed at the surface of the corresponding coating film. Furthermore, the Ag grid having improved oxidation resistance than that of the Ni grid was used. Thus, the sample was not ruptured even when the sample was driven for about 300 hours. The rate of change of insulation resistance (IR) was as low as about −1%.

In Example 6, at least a portion of a line of each Ni grid was exposed at the surface of the corresponding coating film. Furthermore, each Ni grid was covered with the Ag film having outstanding oxidation resistance. Thus, rupturing of each Ni grid was prevented. It was confirmed that the sample was not ruptured even when the sample was driven for about 300 hours, and the rate of change of insulation resistance (IR) was also as low as about 1%. Moreover, as described above, since the oxidation of each Ni grid was suppressed, good solder coverage of about 90% was obtained.

In Example 7, each Sn-plated Al grid was bonded to the surface of each external electrode in which each Ag-plated Ni grid was partly embedded, as described in Example 6. Sn melts at a soldering temperature (250° C.). Therefore, improved solder coverage of about 98% was obtained.

While preferred embodiments of the present invention have been described above, it is to be understood that variations and modifications will be apparent to those skilled in the art without departing the scope and spirit of the present invention. The scope of the present invention, therefore, is to be determined solely by the following claims.

What is claimed is:

1. A thick film electrode comprising:
    a sintered body including a conductive powder and a conductive reinforcing component, the conductive powder being integral with the conductive reinforcing component; wherein
    the conductive reinforcing component is defined by a grid and is embedded in a coating film primarily including the conductive powder; and
    the sintered body is defined by the conductive powder and the conductive reinforcing component which have been heated together at a temperature in a range of about 700° C. to about 800° C.

2. The thick film electrode according to claim 1, wherein the conductive reinforcing component has a core composed of a base metal and a surface composed of a noble metal.

3. The thick film electrode according to claim 1, wherein at least a surface of the conductive reinforcing component has conductivity.

4. The thick film electrode according to claim 1, wherein a portion of a line of the grid defining the conductive reinforcing component is exposed from the coating film to an exterior.

5. A multilayer ceramic electronic device comprising:
a ceramic body;
an internal electrode; and
an external electrode; wherein
the internal electrode is embedded in the ceramic body, the external electrode is disposed on a surface of the ceramic body, and the internal electrode is electrically connected to the external electrode; and
the external electrode includes a sintered body including a conductive powder and a conductive reinforcing component, the conductive powder being integral with the conductive reinforcing component, and the conductive reinforcing component is defined by a grid and is embedded in a coating film mainly containing the conductive powder; and
the sintered body is defined by the conductive powder and the conductive reinforcing component which have been heated together at a temperature in a range of about 700° C. to about 800° C.

6. The multilayer ceramic electronic device according to claim 5, wherein the conductive reinforcing component has a core composed of a base metal and a surface composed of a noble metal.

7. The multilayer ceramic electronic device according to claim 5, wherein at least a surface of the conductive reinforcing component has conductivity.

8. The multilayer ceramic electronic device according to claim 5, wherein the coating film is primarily composed of the conductive powder is disposed on a side surface of the ceramic body so as to be electrically connected to an end of the internal electrode, the conductive reinforcing component is defined by the grid, and a conductive wire-shaped component is embedded in the coating film such that a portion of a line of the grid of the conductive reinforcing component is exposed at the surface of the coating film.

9. The multilayer ceramic electronic device according to claim 5, further comprising a grid member, the surface of the grid member being composed of a metal that melts at a soldering temperature, wherein the grid member is laminated on the external electrode to be electrically connected to the external electrode.

10. The multilayer ceramic electronic device according to claim 5, wherein the ceramic body is a piezoelectric component body composed of a piezoelectric material.

* * * * *